United States Patent
An et al.

(10) Patent No.: US 8,499,444 B2
(45) Date of Patent: Aug. 6, 2013

(54) METHOD OF MANUFACTURING A PACKAGE SUBSTRATE

(75) Inventors: Jin-Yong An, Daejeon (KR); Chang-Sup Ryu, Yongin-si (KR); Jong-Kuk Hong, Suwon-si (KR)

(73) Assignee: Samsung Electro-Mechanics Co., Ltd., Suwon (KR)

( * ) Notice: Subject to any disclaimer, the term of this patent is extended or adjusted under 35 U.S.C. 154(b) by 0 days.

(21) Appl. No.: 12/216,152

(22) Filed: Jun. 30, 2008

(65) Prior Publication Data

US 2009/0169837 A1  Jul. 2, 2009

(30) Foreign Application Priority Data

Dec. 26, 2007  (KR) .................. 10-2007-0137663

(51) Int. Cl.
*H05K 3/02* (2006.01)
*H05K 3/10* (2006.01)

(52) U.S. Cl.
USPC ............... 29/846; 29/830; 29/874; 174/257

(58) Field of Classification Search
USPC ... 29/830, 846, 847, 852, 874; 174/257; 216/18
See application file for complete search history.

(56) References Cited

U.S. PATENT DOCUMENTS

| 5,072,520 A * | 12/1991 | Nelson ........................ 29/852 |
| 6,662,442 B1 * | 12/2003 | Matsui et al. ................ 29/852 |
| 7,346,982 B2 * | 3/2008 | Kim et al. .................... 29/847 |

FOREIGN PATENT DOCUMENTS

| JP | 1994-216195 | 8/1994 |
| JP | 2006-148031 | 6/2006 |
| KR | 10-2007-0116966 | 12/2007 |
| TW | 1247369 | 1/2006 |
| WO | 2006/126621 A1 | 11/2006 |

OTHER PUBLICATIONS

Korean Office Action issued on Apr. 29, 2010 in corresponding Korean Patent Application 10-2007-0137663.
Taiwan Office Action dated Nov. 13, 2012 in corresponding Taiwan Patent Application No. 097125616.
Japanese Office Action for corresponding Japanese Patent Application No. 2008-178311 dated May 10, 2011, 2 pgs.

* cited by examiner

*Primary Examiner* — Donghai D. Nguyen

(57) ABSTRACT

A package substrate and a method of manufacturing the package substrate are disclosed. The method of manufacturing the package substrate may include stacking a second metal layer in which at least one hole is formed over a first metal layer, stacking a barrier layer over the first metal layer exposed in the hole and over the second metal layer, forming at least one bump by filling the hole with a conductive metal, stacking an insulation layer over the bump and forming a circuit pattern over the insulation layer, and removing the first metal layer, the second metal layer, and the barrier layer.

8 Claims, 22 Drawing Sheets

US 8,499,444 B2

METHOD OF MANUFACTURING A PACKAGE SUBSTRATE

CROSS-REFERENCE TO RELATED APPLICATIONS

This application claims the benefit of Korean Patent Application No. 10-2007-0137663 filed with the Korean Intellectual Property Office on Dec. 26, 2007, the disclosure of which is incorporated herein by reference in its entirety.

BACKGROUND

1. Technical Field

The present invention relates to a substrate for use in a package and to a method of manufacturing the package substrate.

2. Description of the Related Art

Electronic devices are being produced with increasingly higher performance and continuously decreasing sizes, and accordingly, the numbers of terminals on semiconductor chips are significantly increasing. As such, the package substrate for mounting semiconductor chips is being required to have finer pitch in the bump portions, as well as high reliability.

Due to such requirements for finer pitch in the bumps of a package substrate, there is a need for new methods of forming bumps.

SUMMARY

An aspect of the invention provides a quick and inexpensive method of forming bumps on a package substrate, and provides a package substrate in which the solder resist layer is formed levelly.

Another aspect of the invention provides a method of manufacturing a substrate for a package that includes stacking a second metal layer in which at least one hole is formed over a first metal layer, stacking a barrier layer over the first metal layer exposed in the hole and over the second metal layer, forming at least one bump by filling the hole with a conductive metal, stacking an insulation layer over the bump and forming a circuit pattern over the insulation layer, and removing the first metal layer, the second metal layer, and the barrier layer.

In certain embodiments, the second metal layer can contain Ni. The barrier layer can contain one of Ti and Cr. The insulation layer can be a solder resist.

Yet another aspect of the invention provides a method of manufacturing a substrate for a package that includes stacking a first layer over each side of a carrier plate with the first layer having at least one edge attached to the carrier plate, stacking a second metal layer in which at least one hole is formed over a first metal layer, stacking a barrier layer over the first metal layer exposed in the hole and over the second metal layer, forming at least one bump by filling the hole with a conductive metal, stacking an insulation layer over the bump and forming a circuit pattern over the insulation layer, separating the carrier plate and the first metal layers, and removing the first metal layer, the second metal layer, and the barrier layer.

The second metal layer can contain Ni, the barrier layer can contain one of Ti and Cr, and the insulation layer can be a solder resist.

Still another aspect of the invention provides a substrate for a package. The package substrate includes a solder resist layer having a level surface, a circuit pattern buried in the solder resist layer, and a bump protruding from the solder resist layer.

A surface treatment layer can be stacked over the bump.

Additional aspects and advantages of the present invention will be set forth in part in the description which follows, and in part will be obvious from the description, or may be learned by practice of the invention.

DETAILED DESCRIPTION

Figure 1:
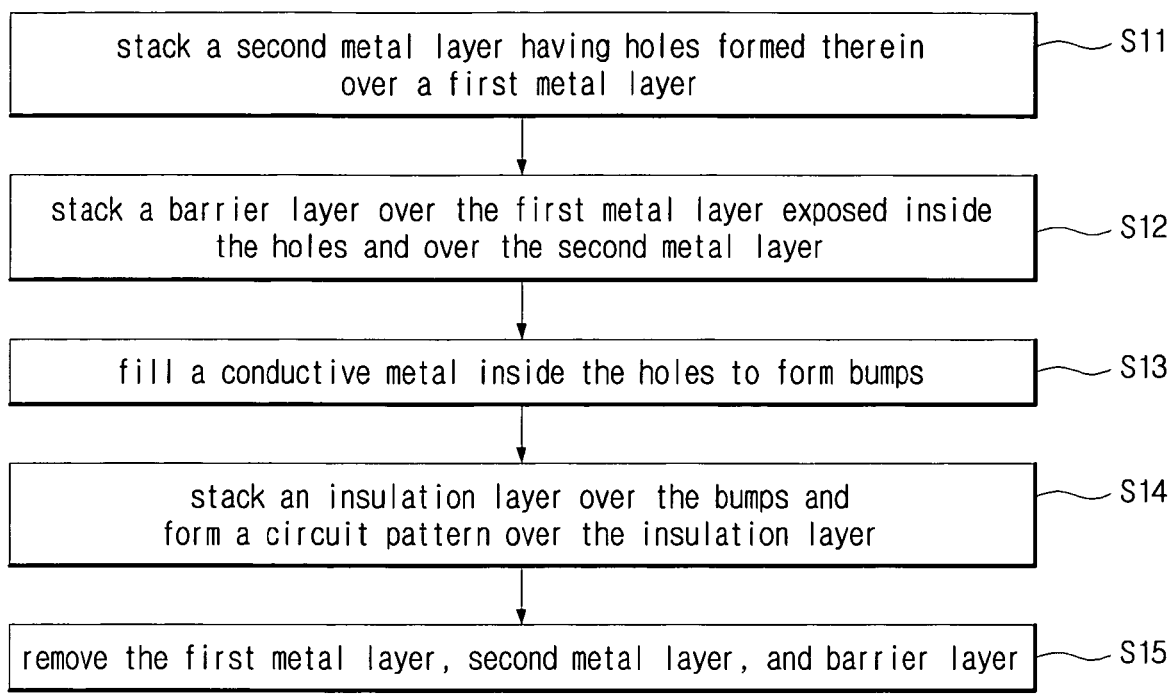
FIG. 1 is a flowchart for a method of manufacturing a package substrate according to an embodiment of the invention.

The package substrate and method of manufacturing the package substrate according to certain embodiments of the invention will be described below in more detail with reference to the accompanying drawings. Those components that are the same or are in correspondence are rendered the same reference numeral regardless of the figure number, and redundant explanations are omitted.

FIG. 1 is a flowchart for a method of manufacturing a package substrate according to an embodiment of the invention, and FIG. 2 through FIG. 10 are cross sectional views representing a process diagram for a method of manufacturing a package substrate according to an embodiment of the invention. In FIGS. 2 to 10, there are illustrated a first metal layer 211, a carrier plate 212, a second metal layer 22, a barrier layer 23, bumps 24, pads 25, insulation layers 26, openings 27, and surface treatment layers 28.

Figure 2:
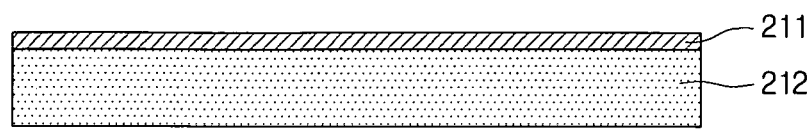
FIG. 2, FIG. 3, FIG. 4, FIG. 5, FIG. 6, FIG. 7, FIG. 8, FIG. 9, and FIG. 10 are cross sectional views representing a process diagram for a method of manufacturing a package substrate according to an embodiment of the invention.
Figure 3:
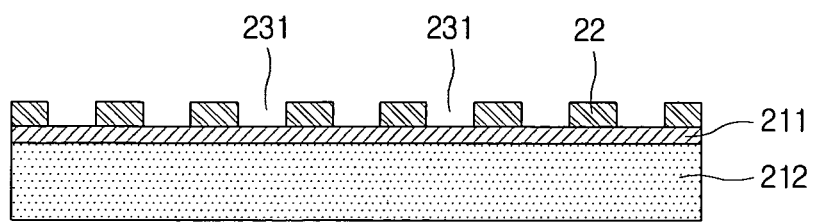

Operation S11 may include stacking a second metal layer, in which holes may be formed, over the first metal layer. FIG. 2 and FIG. 3 represent corresponding processes.

In order that the first metal layer 211 may not bend, the first metal layer 211 can be supported by a carrier plate 212. The carrier plate 212 can be removed in a subsequent process. In certain embodiments, the first metal layer 211 can be a layer of copper. However, any of a variety of metals may be used that can be removed by applying an etchant.

The second metal layer 22 can be formed over the first metal layer 211 by plating. Here, holes 231 may be formed in the second metal layer 22. The insides of these holes 231 can be filled with a metal in a subsequent process to form bumps 24. The stacking of the second metal layer 22 over the first metal layer 211 in such a way that holes 231 may be formed can be achieved using a subtractive method or a semi-additive method.

A subtractive method may involve stacking a plating layer over the entire surface of the first metal layer 211 and then removing portions of the plating layer by etching, to form the second metal layer 22. A semi-additive method may involve stacking a photosensitive film over the first metal layer 211, removing portions of the photosensitive film where the second metal layer 22 is to be formed by exposing and developing such portions, and then performing electroplating, to form the second metal layer 22.

In certain embodiments, the second metal layer 22 can be a layer of copper (Cu), while in certain other embodiments, the second metal layer 22 can be a layer of nickel (Ni). Of course, various other etchable metals may also be used.

Figure 4:
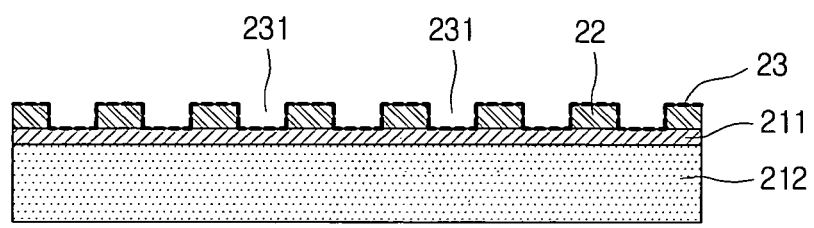

Operation S12 may include stacking a barrier layer over portions of the first metal layer exposed inside the holes and over the second metal layer, where FIG. 4 represents a corresponding process.

The barrier layer 23 may be a layer that is not removed during the removal of the first metal layer 211 and second metal layer 22 by etching, and may contain titanium (Ti) or chromium (Cr). The barrier layer 23 can be stacked over the surfaces of the first metal layer 211 and second metal layer 22 exposed to the exterior. The stacking of the barrier layer 23 can be achieved by a method such as electroless plating, electroplating, and sputtering.

Figure 5:
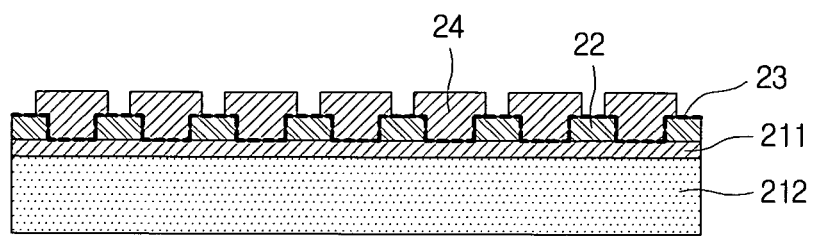

Operation S13 may include filling a conductive metal inside the holes to form bumps, where FIG. 5 represents a corresponding process.

The portions that are not to be plated can be covered with a dry film, after which electroplating can be performed over the insides of the holes 231 that are to be plated, whereby the bumps 24 may be formed as in the example illustrated in FIG. 5. The bumps 24 can be made of copper. It is also possible to form a circuit pattern at the same time concurrently with the forming of the bumps 24.

Figure 6:
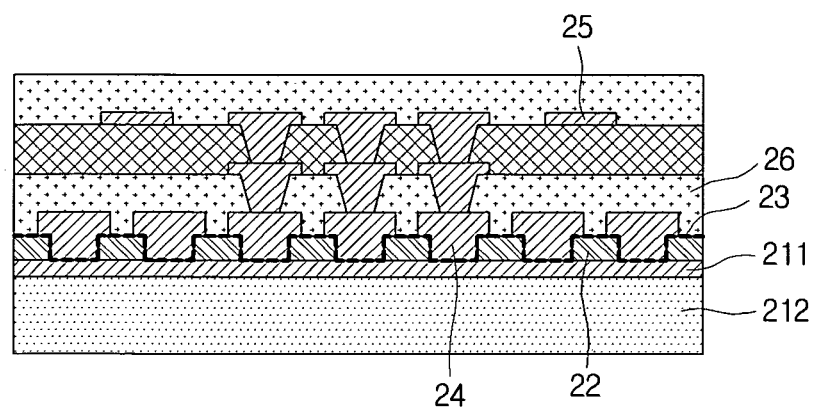
Figure 7:
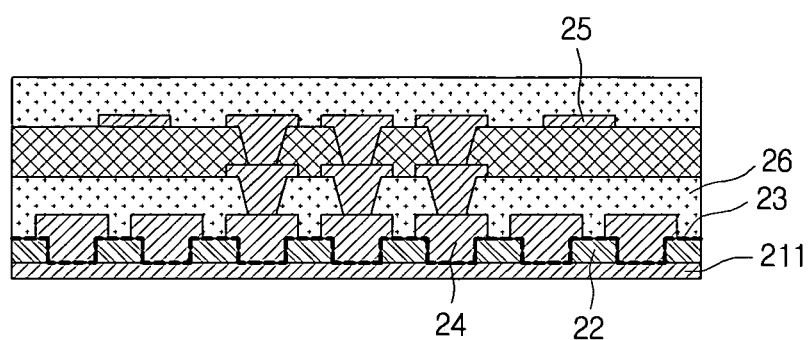

Operation S14 may include stacking an insulation layer over the bumps and forming a circuit pattern over the insulation layer. FIG. 6 represents a corresponding process.

The insulation layer 26 can be a solder resist. When the insulation layer 26 is stacked over the bumps 24, the second metal layer 22 and the insulation layer 26 may interface each other levelly. Later, when the second metal layer 22 is removed, the insulation layer 26 may be exposed to the exterior, resulting in all of the bumps 24 protruding to a uniform height from a level insulation layer 26. A circuit pattern can be formed over the insulation layer 26, and another insulation layer can be stacked over the circuit pattern. On the outer layers, pads 25 may be formed that enable an electrical connection with an external electronic component. Removing the carrier plate 212 may result in the configuration illustrated in FIG. 7.

Figure 8:
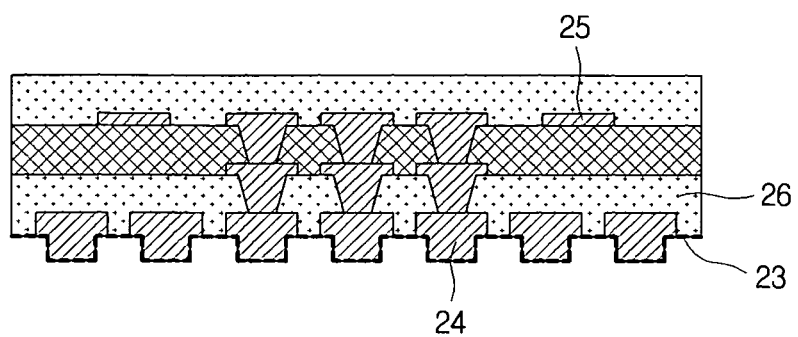
Figure 9:
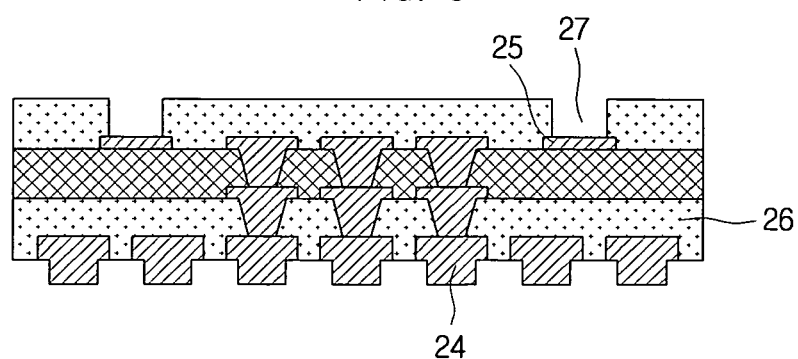
Figure 10:
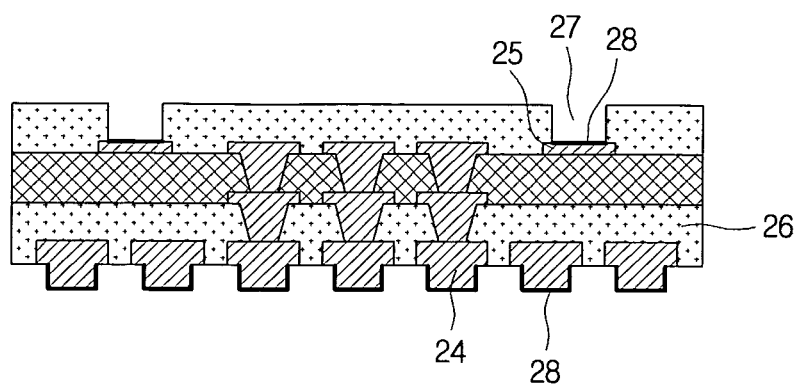

Operation S15 may include removing the first metal layer, the second metal layer, and the barrier layer, where FIGS. 8 and 9 represent corresponding processes.

The first metal layer 211 and second metal layer 22 may or may not be copper. An appropriate etchant can be used that is suitable for removing the corresponding metal. Here, the barrier layer 23 may not be removed with the first metal layer 211 and second metal layer 22. If titanium or chromium is used for the barrier layer 23 and nickel is used for the second metal layer 22, as in this particular embodiment, an etchant for removing nickel may be used without damaging the barrier layer 23. In this way, the bumps 24 can be protected by the barrier layer 23.

While proceeding with this process, openings 27 may be formed such that the pads 25 are exposed. Later, nickel plating and gold plating can be performed over the surfaces of the pads 25 and bumps 24, to form surface treatment layers 28.

Figure 11:
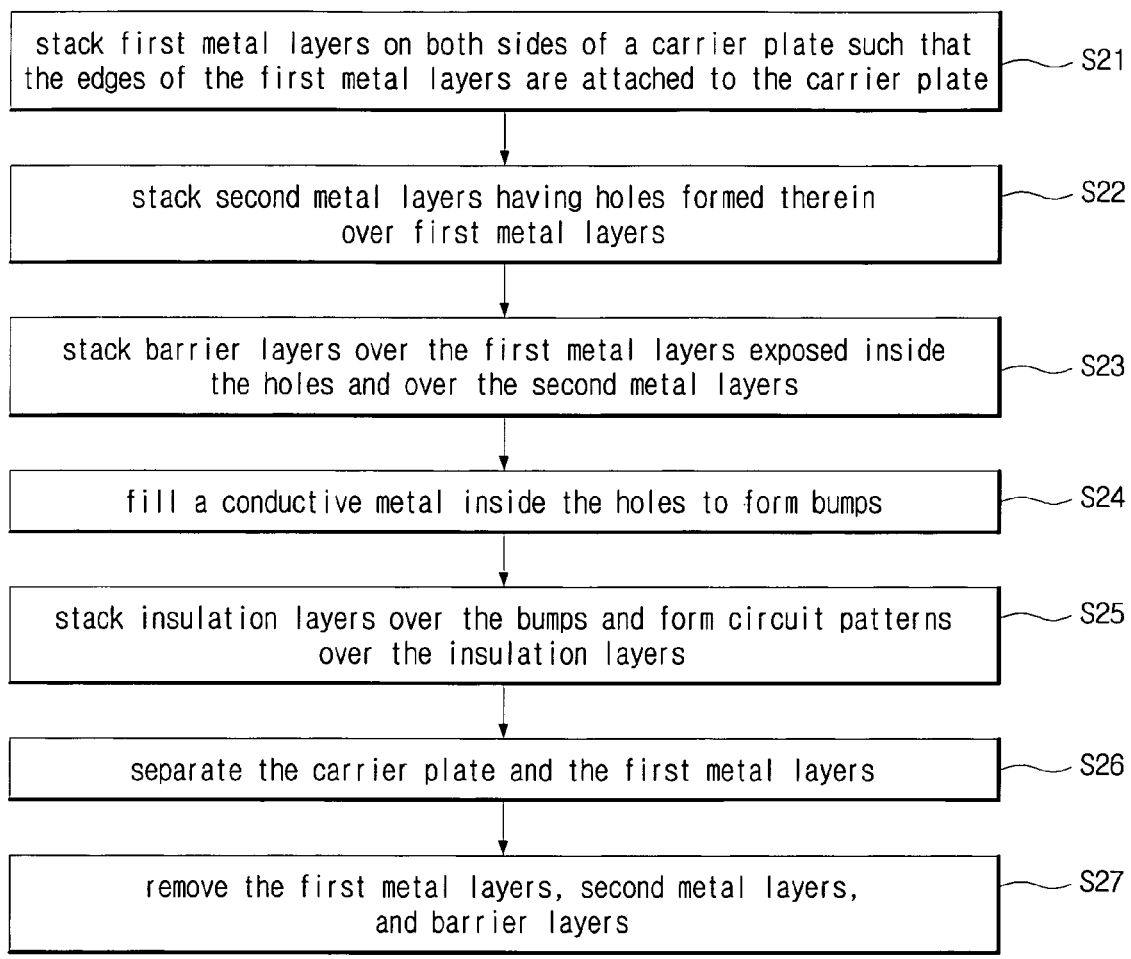
FIG. 11 is a flowchart for a method of manufacturing a package substrate according to another embodiment of the invention.

FIG. 11 is a flowchart for a method of manufacturing a package substrate according to another embodiment of the invention, and FIG. 12 through FIG. 21 are cross sectional views representing a process diagram for a method of manufacturing a package substrate according to another embodiment of the invention. In FIGS. 12 to 21, there are illustrated first metal layers 311, a carrier plate 312, adhesive 313, second metal layers 32, barrier layers 33, bumps 34, pads 35, insulation layers 36, openings 37, and surface treatment layers 38.

Figure 12:
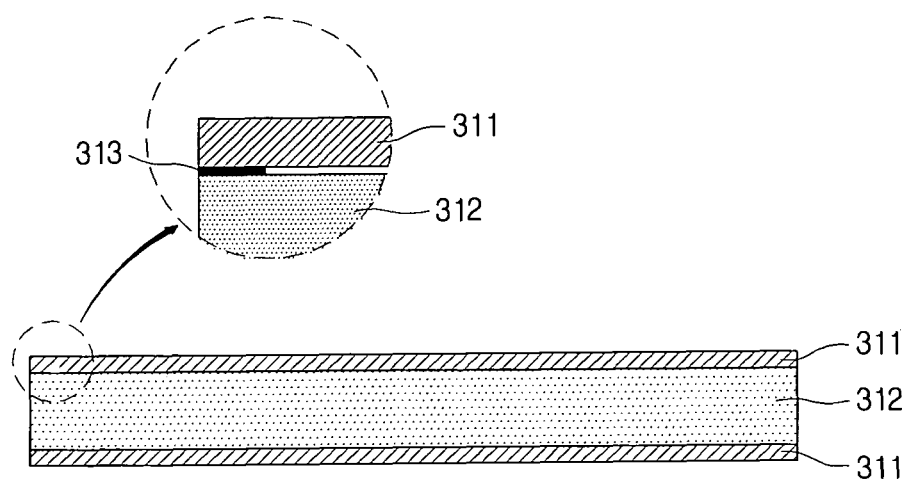
FIG. 12, FIG. 13, FIG. 14, FIG. 15, FIG. 16, FIG. 17, FIG. 18, FIG. 19, FIG. 20, and FIG. 21 are cross sectional views representing a process diagram for a method of manufacturing a package substrate according to another embodiment of the invention.

Operation S21 may include stacking a first metal layer on either side of a carrier plate such that at least one edge of each first metal layer is attached to the carrier plate. FIG. 12 represents a corresponding process.

This particular embodiment illustrates a method of manufacturing a pair of package substrates using both sides of a carrier plate 312. In order to readily remove the carrier plate 312 in a subsequent process, the first metal layers 311 can be attached using adhesive 313 only at the edges. A copper clad laminate can be used for the carrier plate 312.

Figure 13:
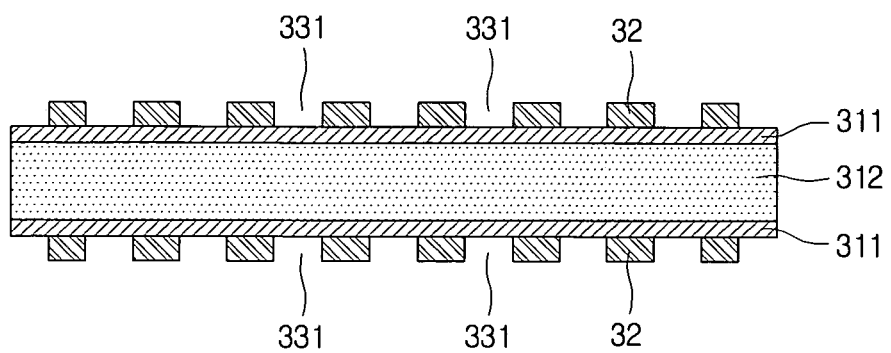

Operation S22 may include stacking a second metal layer, in which holes may be formed, over the first metal layer. FIG. 13 represents a corresponding process.

The second metal layer 32 can be formed over the first metal layer 311 by plating. Holes 331 may be formed in the second metal layer 32. The insides of these holes 331 can be filled with a metal in a subsequent process to form bumps 34. The stacking of the second metal layer 32 over the first metal layer 311 in such a way that holes 331 may be formed can be achieved using a subtractive method or a semi-additive method. In certain embodiments, the second metal layer 32 can be a layer of copper (Cu), while in certain other embodiments, the second metal layer 32 can be a layer of nickel (Ni). Of course, various other etchable metals may also be used.

Figure 14:
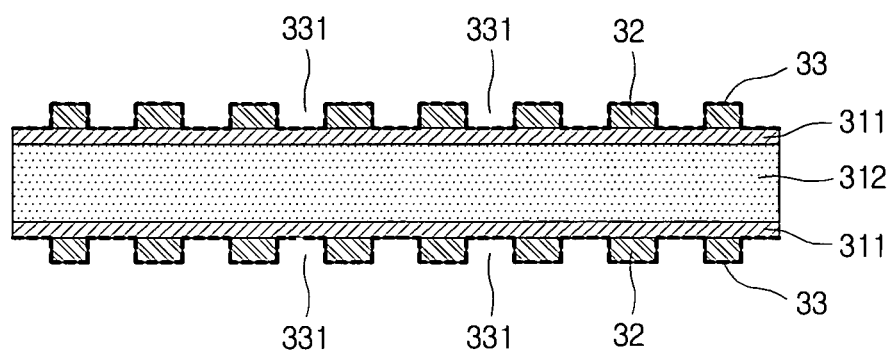

Operation S23 may include stacking a barrier layer over portions of the first metal layer exposed inside the holes and over the second metal layer, where FIG. 14 represents a corresponding process.

The barrier layer 33 may be a layer that is not removed during the removal of the first metal layer 311 and second metal layer 32 by etching, and may contain titanium (Ti) or chromium (Cr). The barrier layer 33 can be stacked over the surfaces of the first metal layer 311 and second metal layer 32 exposed to the exterior. The stacking of the barrier layer 33 can be achieved by a method such as electroless plating, electroplating, and sputtering.

Figure 15:
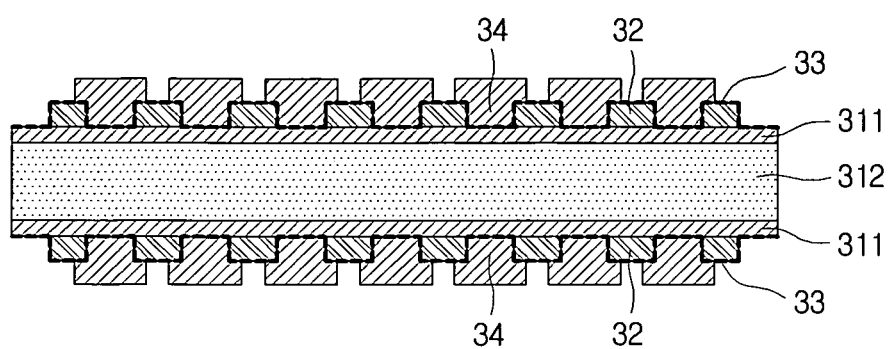

Operation S24 may include filling a conductive metal inside the holes to form bumps, where FIG. 15 represents a corresponding process.

The portions that are not to be plated can be covered with a dry film, after which electroplating can be performed over the insides of the holes 331 that are to be plated, whereby the bumps 34 may be formed as in the example illustrated in FIG. 15. The bumps 34 can be made of copper.

Figure 16:
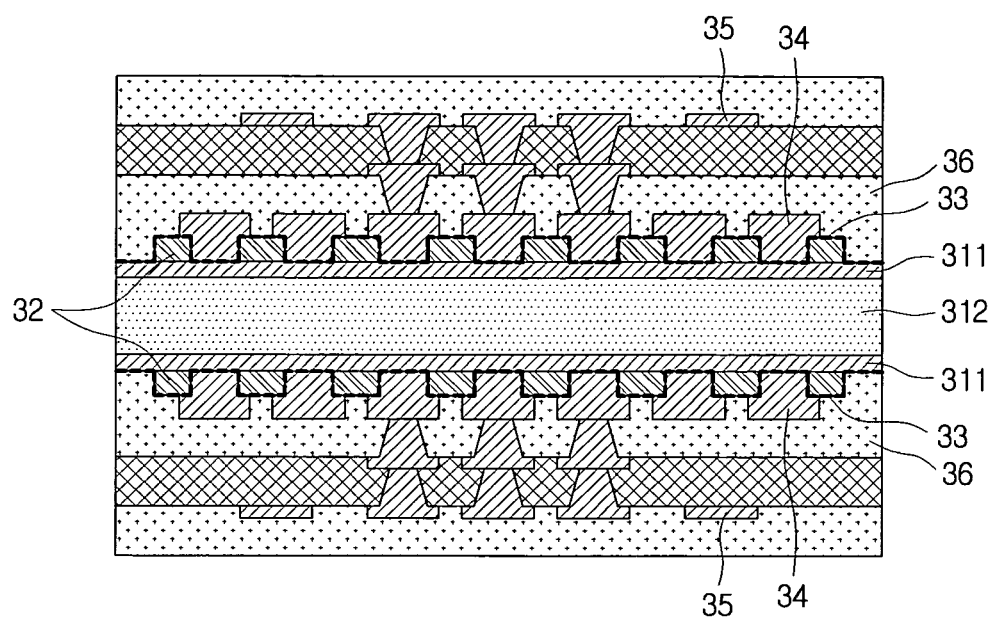

Operation S25 may include stacking an insulation layer over the bumps and forming a circuit pattern over the insulation layer. FIG. 16 represents a corresponding process.

The insulation layer 36 can be a solder resist. When the insulation layer 36 is stacked over the bumps 34, the second metal layer 32 and the insulation layer 36 may come into contact levelly. Later, when the second metal layer 32 is removed, the insulation layer 36 may be exposed to the exterior, resulting in all of the bumps 34 protruding to a uniform height from a level insulation layer 36. A circuit pattern can be formed over the insulation layer 36, and another insulation layer can be stacked over the circuit pattern. On the outer layers, pads 35 may be formed that enable an electrical connection with an external electronic component. The stacking operation, can be performed symmetrically about the carrier plate 312.

Figure 17:
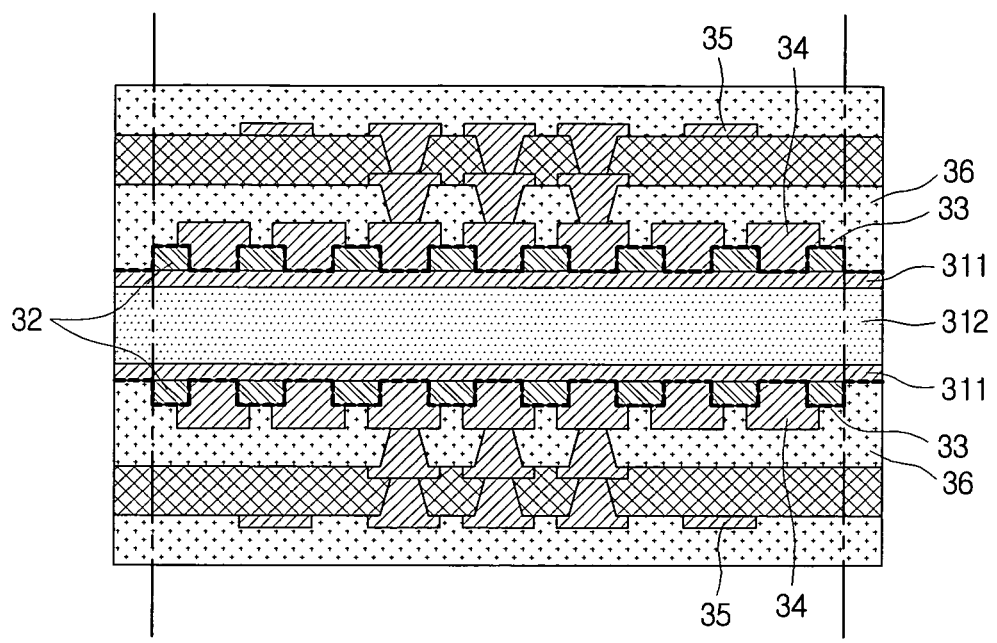
Figure 18:
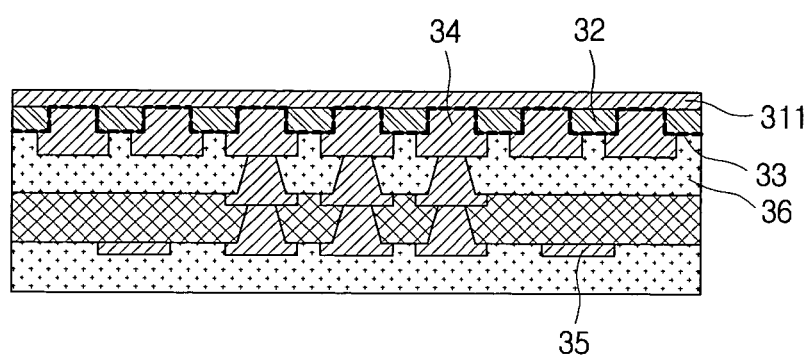

Operation S26 may include separating the carrier plate and the first metal layer, and FIG. 17 represents a corresponding process.

The dot-dash lines in FIG. 17 represent the positions where dicing may be performed. These can be at a more inward side than the adhesive 313, so that by cutting along these lines, the carrier plate 312 and first metal layers 311 may readily be separated. The illustrations in FIG. 18 onward represent processes for one of the pair of package substrates formerly coupled to the carrier plate 312. The processes performed for the other package substrate can be more or less the same.

Figure 19:
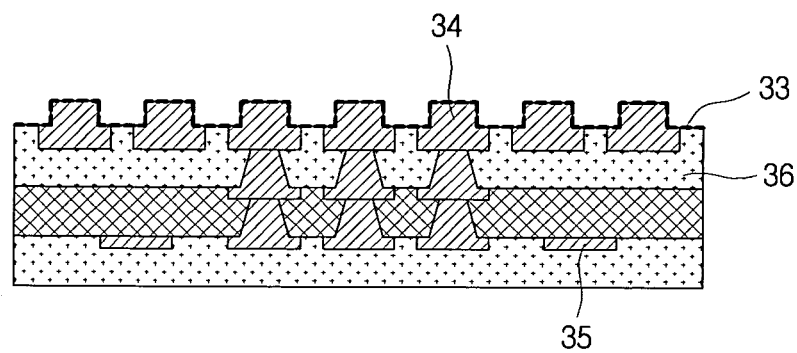
Figure 20:
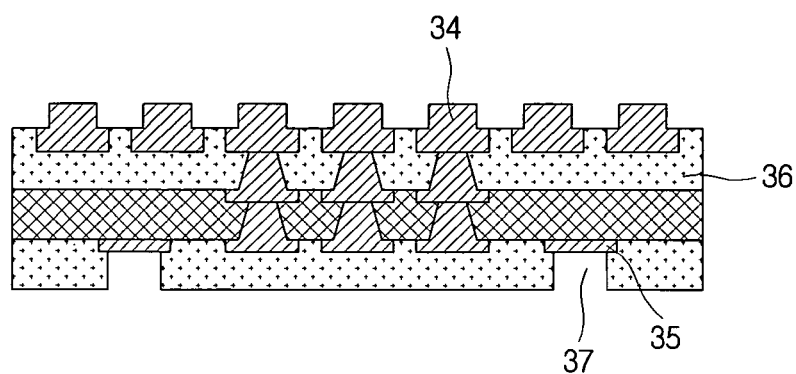
Figure 21:
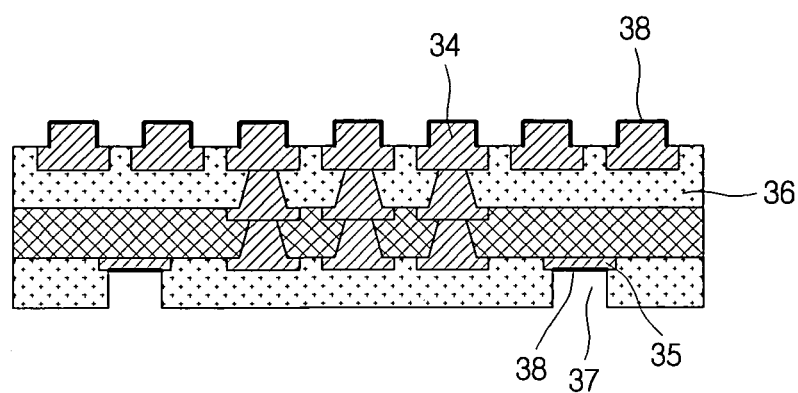

Operation S27 may include removing the first metal layer, the second metal layer, and the barrier layer, where FIG. 19 represents a corresponding process.

The first metal layer 311 and second metal layer 32 may or may not be copper. An appropriate etchant can be used that is suitable for removing the corresponding metal. Here, the barrier layer 33 may not be removed with the first metal layer 311 and second metal layer 32. If titanium or chromium is used for the barrier layer 33 and nickel is used for the second metal layer 32, as in this embodiment, an etchant for removing nickel may be used without damaging the barrier layer 33. In this way, the bumps 34 can be protected by the barrier layer 33.

While proceeding with this process, openings 37 may be formed such that the pads 35 are exposed. Later, nickel plating and gold plating can be performed over the surfaces of the pads 35 and bumps 34, to form surface treatment layers 38.

Figure 22:
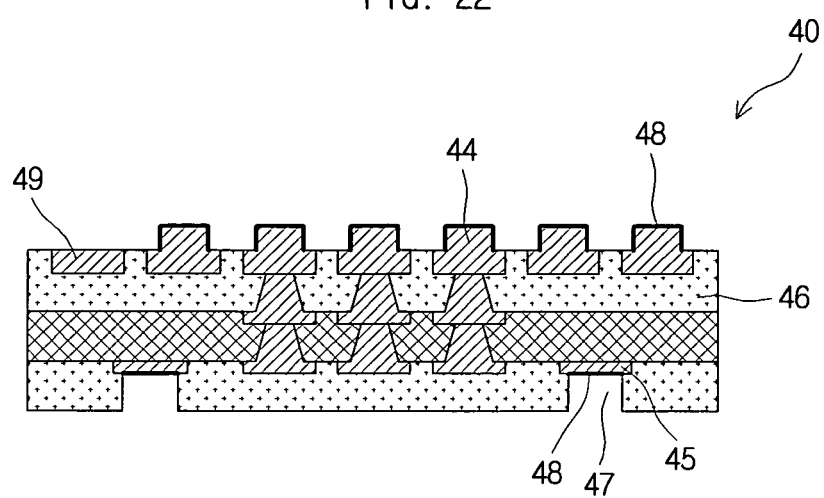
FIG. 22 is a cross sectional view of a package board according to yet another embodiment of the invention.

FIG. 22 is a cross sectional view of a package board according to yet another embodiment of the invention. In FIG. 22, there are illustrated a package substrate 40, bumps 44, pads 45, solder resist layers 46, openings 47, surface treatment layers 48, and a circuit pattern 49.

The package substrate 40 according to this embodiment can be a substrate for mounting a semiconductor chip, where the semiconductor chip can be electrically connected with the pads 45. In the package substrate 40 of this embodiment, the circuit pattern 49 can be buried in the solder resist layer 46. Also, the bumps 44 may protrude from the solder resist layer 46. The solder resist layer 46 can be level, and the bumps 44 can all protrude to substantially the same height.

Consequently, in cases where the package substrate 40 is mounted onto a different mother board, the filler may readily flow in between the mother board and the package substrate 40. In other words, the problem of having the flow of the filler blocked by protrusions in the solder resist layer 46 can be avoided. As such, the package substrate 40 may be mounted on a mother board with higher reliability.

The solder resist layer 46 can be level. One method of achieving this can be to have the solder resist layer 46 levelly interface with the second metal layer, as in the processes of the previously described embodiments.

Surface treatment layers 48 can be stacked over the surfaces of the pads 45 and bumps 44. The surface treatment layers 48 can be obtained by performing gold plating after nickel plating.

According to certain embodiments of the invention as set forth above, the bumps may be formed by a plating method, so that the bumps may be formed on a package substrate with lower costs and reduced process times. Also, the solder resist layer may not protrude outwards in the direction of the bumps, but rather form a level surface.

While the spirit of the invention has been described in detail with reference to particular embodiments, the embodiments are for illustrative purposes only and do not limit the invention. It is to be appreciated that those skilled in the art can change or modify the embodiments without departing from the scope and spirit of the invention. As such, many embodiments other than those set forth above can be found in the appended claims.

What is claimed is:

1. A method of manufacturing a substrate for a package, the method comprising:
   stacking a second metal layer over a first metal layer, the second metal layer having at least one hole formed therein;
   stacking a barrier layer on surfaces of the first and second metal layers both inside and outside of the hole;
   forming at least one bump such that a conductive metal is filled in the hole and expanded around the hole;
   stacking an insulation layer over the bump and forming a circuit pattern over the insulation layer; and
   removing the first metal layer, the second metal layer, and the barrier layer from the bump and the insulation layer.

2. The method of claim 1, wherein the second metal layer contains Ni.

3. The method of claim 1, wherein the barrier layer contains one of Ti and Cr.

4. The method of claim 1, wherein the insulation layer is a solder resist.

5. A method of manufacturing a substrate for a package, the method comprising:
   stacking a first layer over each side of a carrier plate, the first layer having at least one edge attached to the carrier plate;
   stacking a second metal layer over the first metal layer, the second metal layer having at least one hole formed therein;
   stacking a barrier layer on surfaces of the first and second metal layers both inside and outside of the hole;
   forming at least one bump such that a conductive metal is filled in the hole and expanded around the hole;
   stacking an insulation layer over the bump and forming a circuit pattern over the insulation layer;
   separating the carrier plate and the first metal layers; and
   removing the first metal layer, the second metal layer, and the barrier layer from the bump and the insulation layer.

6. The method of claim 5, wherein the second metal layer contains Ni.

7. The method of claim 5, wherein the barrier layer contains one of Ti and Cr.

8. The method of claim 5, wherein the insulation layer is a solder resist.

* * * * *